United States Patent [19]
Westwick

[11] Patent Number: 5,511,126
[45] Date of Patent: Apr. 23, 1996

[54] METHOD AND APPARATUS FOR REDUCING JITTER AND IMPROVING TESTABILITY OF AN OSCILLATOR

[75] Inventor: Alan L. Westwick, Austin, Tex.

[73] Assignee: Motorola, Inc., Schaumburg, Ill.

[21] Appl. No.: 376,997

[22] Filed: Feb. 23, 1995

Related U.S. Application Data

[62] Division of Ser. No. 111,793, Aug. 25, 1993, Pat. No. 5,446,420.

[51] Int. Cl.$^6$ .............................. H03M 1/10; H03B 5/00
[52] U.S. Cl. ..................... 331/44; 331/179; 331/158; 324/548; 341/120
[58] Field of Search ................... 324/672, 678, 324/679, 681, 682, 548, 677; 331/158, 183, 116 F, 116 S, 44, 179, 175; 341/120, 121, 118

[56] References Cited

U.S. PATENT DOCUMENTS

| | | | |
|---|---|---|---|
| 3,824,459 | 7/1974 | Uchida | 324/679 |
| 4,093,915 | 6/1978 | Briefer | 324/60 R |
| 4,782,309 | 11/1988 | Benjaminson | 331/139 |
| 5,029,268 | 7/1991 | Pfandler | 331/158 |
| 5,036,294 | 7/1991 | McCaslin | 331/1 A |
| 5,063,359 | 11/1991 | Leonowich | 331/116 FE |
| 5,117,206 | 5/1992 | Imamura | 331/158 |
| 5,151,666 | 9/1992 | Tamagawa | 331/64 |
| 5,175,547 | 12/1994 | Lyon et al. | 341/120 |

FOREIGN PATENT DOCUMENTS

| | | | |
|---|---|---|---|
| 53-87275 | 8/1978 | Japan | G01R 27/26 |
| 1-101008 | 4/1989 | Japan | H03B 5/36 |
| 63-152808 | 12/1989 | Japan | H03B 5/32 |
| 2-76304 | 3/1990 | Japan | H03B 5/32 |

OTHER PUBLICATIONS

Takehiko Uno and Yoshio Shimoda; "A New Digital TCXO Circuit Using a Capacitor-Switch Array"; 37th Annual Frequency Control Symposium; IEEE 1983; pp. 434–441 (1983).

*Primary Examiner*—Benny Lee
*Assistant Examiner*—Arnold Kinkead
*Attorney, Agent, or Firm*—Paul J. Polansky

[57] ABSTRACT

An oscillator such as a pulled-crystal oscillator (50) provides low clock jitter by converting a sinusoidal voltage on a crystal's (51) terminals into a digital square wave with a comparator (56). The oscillating frequency of the crystal (51) is pulled by selectively switching in extra capacitance through capacitor digital-to-analog converters (CDACs) (57, 58). The oscillator (50) has built-in testability which allows individual capacitors in the CDACs (57, 58) to be quickly tested for opens. A scan path is connected to the inputs of the CDACs (57, 58) for selecting individual capacitors. A first input terminal of the comparator (56) is precharged before a capacitor under test (171) is connected. A comparison voltage is provided to the second input terminal. The capacitor under test (171) is determined to be functional if, after being connected to the first input terminal of the comparator (56), it discharges the first input terminal to a voltage below the comparison voltage, causing the comparator (56) to switch.

23 Claims, 6 Drawing Sheets

FIG.1 —PRIOR ART—

METHOD AND APPARATUS FOR REDUCING JITTER AND IMPROVING TESTABILITY OF AN OSCILLATOR

This is a division of application Ser. No. 08/111,793, filed Aug. 25, 1993, and now U.S. Pat. No. 5,446,420.

CROSS-REFERENCE TO RELATED APPLICATION

Related subject matter is contained in my copending application, attorney docket number SC-02067A, Ser. No. 08/111,792, now U.S. Pat. No. 5,457,433, filed concurrently herewith, entitled "Low Power Inverter for Crystal Oscillator Buffer or the Like" and assigned to the assignee hereof.

FIELD OF THE INVENTION

This invention relates generally to electrical circuits, and more particularly, to oscillators and testing methods and circuits therefor.

BACKGROUND OF THE INVENTION

A basic phase locked loop (PLL) has a phase detector which provides a phase detect output signal indicative of the phase difference between a loop clock signal and a reference clock signal. The phase detector provides the phase detect output signal to an input of a loop filter. The loop filter is a low-pass filter which provides an output voltage level indicative of the length of time the phase detector detects the two clock signals are out of phase. The output of the loop filter drives an input of a voltage controlled oscillator (VCO). The VCO then provides a clock output signal having a desired frequency. The clock output signal is divided in a loop divider to provide the loop clock signal. Thus, the PLL is able to generate the clock output signal having a frequency that is many times greater than that of the reference clock signal, based on the value of the loop divider.

A digital PLL uses an oscillator which responds to a digital code provided by a digital loop filter. This oscillator is variously referred to in the art as a VCO, a digital VCO (DVCO), a digitally-controlled oscillator (DXCO), or the like, although the term VCO will be used herein. One type of VCO used in digital PLLs is known as a pulled-crystal VCO. The pulled-crystal VCO is useful in applications in which the nominal clock output frequency is fixed but the actual frequency may vary by a relatively small amount. One case in which a pulled-crystal VCO is useful is a telecommunications system in which the far end provides data at a nominal rate which may vary by a certain amount, but does not provide a separate clock signal.

The pulled-crystal VCO uses not only a conventional resistor and inverter to bias a crystal, but also a variable capacitance. The pulled-crystal VCO changes the amount of load capacitance on the crystal's terminals to "pull" the frequency by relatively-small amounts. A capacitor digital-to-analog converter (CDAC) network provides the variable capacitance based on the loop filter's digital code. However, known CDACs present some problems, including testability, clock output signal jitter, and circuit design.

For proper testability, it is desirable to determine whether the CDAC's capacitors have been fabricated properly. Fabrication problems may result in either open circuits into one of the capacitor's terminals, or short circuits between the capacitor's terminals. In the CDAC section of the pulled-crystal VCO, short circuits may be easily tested. A test code connects all capacitors to the crystal terminals, and a testing apparatus detects a short if the amount of leakage current is excessive. Open circuit testing, however, is normally considered impractical. With a functional test it is possible to detect open capacitors, but this test requires a very long time for the clock output signal to stabilize to detect the small changes in output frequency. For example, CDAC capacitors may affect the clock output signal frequency by as little as fifteen parts-per-million (ppm). Thus the functional test must be run for enough cycles to detect a deviation from a frequency change of 15 ppm. Furthermore, each capacitor must be individually tested, multiplying this test period by the number of capacitors in the CDAC.

Another problem is clock output signal jitter. Switching additional capacitors onto crystal terminals results in a "glitch", which can introduce jitter into the clock output signal. One known method to minimize the effects of switching capacitors into the array was taught by Imamaru in U.S. Pat. No. 5,117,206, issued on May 26, 1992. Imamaru slowly changes the impedance of switching elements in order to avoid the effects of discretely switching a new capacitor into the circuit. However, Imamaru's capacitor array requires additional circuitry to generate the voltages provided to the switching elements.

The requirements for high performance and low power consumption also make circuit design of the crystal's inverter difficult. The inverter must be strong enough to drive a widely-varying capacitive load without switching transients, which cause signal jitter. The inverter must have matched pullup and pulldown characteristics in order to maintain proper duty cycle. However, the stronger the inverter, the higher the power consumption. Also, the pulled-crystal oscillator outputs a sinusoidal waveform which must be converted into a digital clock, further complicating circuit design.

Each of these problems exists to varying degrees in known pulled-crystal VCOs. It would thus be desirable to have an oscillator which simultaneously alleviates all these problems.

SUMMARY OF THE INVENTION

Accordingly, the present invention provides, in one form, a method for testing a pulled-crystal oscillator. The pulled-crystal oscillator has a capacitor digital-to-analog converter (CDAC) coupled to a first crystal terminal, and a capacitor coupled to a second crystal terminal. A first terminal of a first test capacitor is coupled to a first terminal of a comparator. A first predetermined voltage is provided to a second terminal of the first test capacitor. A voltage at the first terminal of the first test capacitor is precharged to a second predetermined voltage during a first portion of a test period. A comparison voltage is provided to a second terminal of the comparator. The comparison voltage is characterized as being between the first and second predetermined voltages. A first terminal of a selected capacitor of a first plurality of capacitors of the CDAC is coupled to the first terminal of the comparator during a second portion of the test period. A second terminal of the selected capacitor is coupled to the first predetermined voltage terminal during the second portion of the test period. An output of the comparator is provided as a test result of the selected capacitor at an end of the second portion of the test period. The selected capacitor provides a voltage to the first terminal of the comparator which is between the comparison voltage and the first predetermined voltage if the selected capacitor is functional. The selected capacitor provides the voltage to the first terminal of the comparator between the second predetermined voltage and the comparison voltage if the selected capacitor is not functional.

These and other features and advantages will be more clearly understood from the following detailed description taken in conjunction with the accompanying drawings.

DETAILED DESCRIPTION OF A PREFERRED EMBODIMENT

Figure 1:
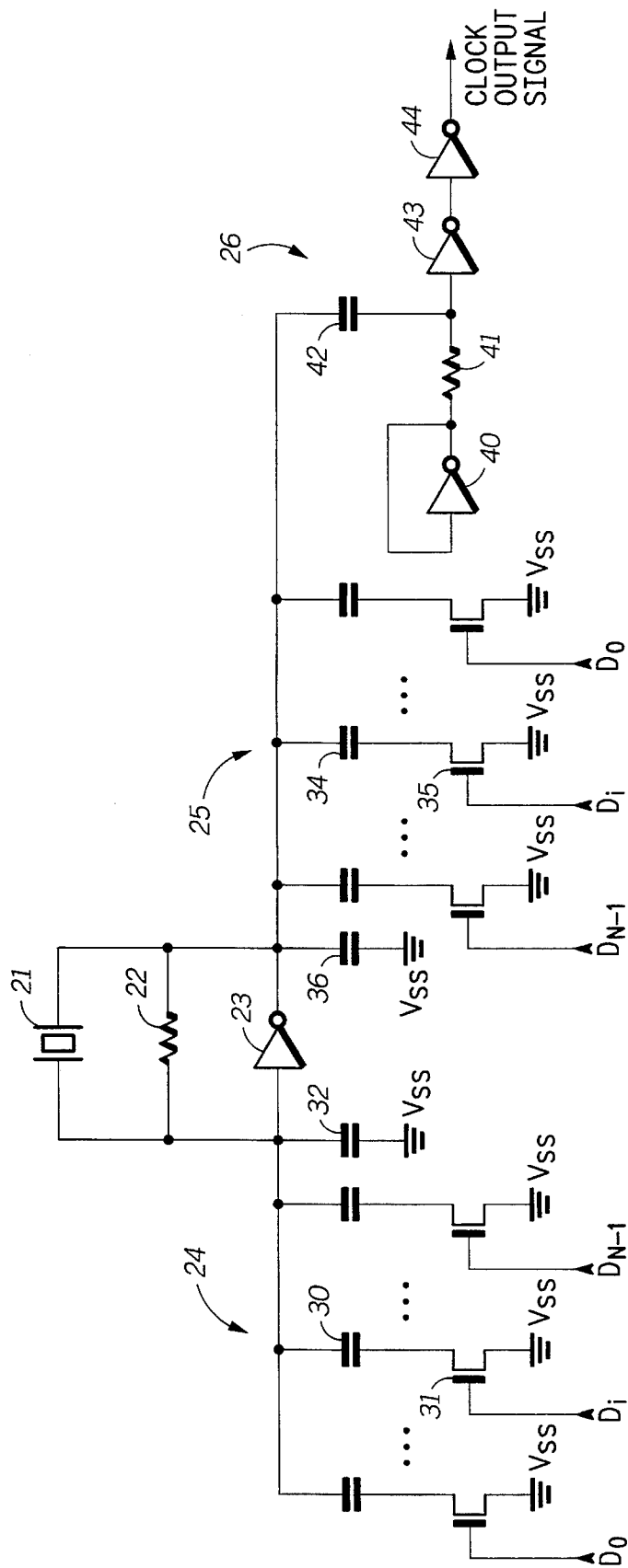
FIG. 1 illustrates in partial logic diagram and partial schematic diagram form a pulled-crystal oscillator according to the prior art.

FIG. 1 illustrates in partial logic diagram and partial schematic diagram form a pulled-crystal oscillator 20 according to the prior art. Oscillator 20 includes generally a crystal 21, a resistor 22, an inverter 23, a first capacitor array 24, a second capacitor array 25, and a coupling circuit 26. Crystal 21 has first and second terminals. Resistor 22 has a first terminal connected to the first terminal of crystal 21, and a second terminal connected to the second terminal of crystal 21. Inverter 23 has a first terminal connected to the first terminal of crystal 21, and a second terminal connected to the second terminal of crystal 21.

Capacitor array 24 is connected to the first terminal of crystal 21 and includes N capacitors switched by a corresponding one of input signals labelled "$D_0$–$D_{N-1}$". Each leg of capacitor array 24 includes a capacitor and a switch, in series between the first terminal of crystal 21 and a power supply voltage terminal labelled "$V'_{SS}$". $V_{SS}$ is a more-negative power supply voltage terminal having a nominal potential of approximately zero volts. An illustrative leg is shown including a capacitor 30, and a switch 31. Capacitor 30 has a first terminal connected to the first terminal of crystal 21, and a second terminal. Switch 31 has a first terminal connected to the second terminal of capacitor 30, and a second terminal connected to $V_{SS}$, and is opened and closed by a digital control signal labelled "$D_i$", where i corresponds to the significance of the capacitor. Capacitor array 24 also includes a capacitor 32 having a first terminal connected to the first terminal of crystal 21, and a second terminal connected to $V_{SS}$.

Capacitor array 25 is connected to the second terminal of crystal 21 and includes N capacitors switched by a corresponding one of input signals $D_0$–$D_{N-1}$. Like array 24, each leg of capacitor array 25 includes a capacitor and a switch, in series between the second terminal of crystal 21 and $V_{SS}$. An illustrative leg is shown including a capacitor 34, and a switch 35. Capacitor 34 has a first terminal connected to the second terminal of crystal 21, and a second terminal. Switch 35 has a first terminal connected to the second terminal of capacitor 32, and a second terminal connected to $V_{SS}$, and is opened and closed by signal $D_i$. Capacitor array 25 also includes a capacitor 36 having a first terminal connected to the second terminal of crystal 21, and a second terminal connected to $V_{SS}$.

Coupling circuit 26 includes an inverter 40, a resistor 41, a capacitor 42, and inverters 43 and 44. Inverter 40 has an input terminal, and an output terminal connected thereto. Resistor 41 has a first terminal connected to the output terminal of inverter 40, and a second terminal. Capacitor 42 has a first terminal connected to the second terminal of crystal 21, and a second terminal connected to the second terminal of resistor 41. Inverter 43 has an input terminal connected to the second terminals of resistor 41 and capacitor 42, and an output terminal. Inverter 44 has an input terminal connected to the output terminal of inverter 43, and an output terminal for providing a signal labelled "CLOCK OUTPUT SIGNAL".

Oscillator 20 is a conventional pulled-crystal oscillator which has the problems of open capacitor testing, CLOCK OUTPUT SIGNAL jitter, and circuit design as mentioned previously. In particular, coupling circuit 26 converts a sinusoidal waveform into a clean, digital square wave. The circuit design choices used for coupling circuit 26 affect power consumption and duty cycle distortion. Coupling circuit 26 includes self-biased complementary metal-oxide-semiconductor (CMOS) inverter 40 in order to keep the input of inverter 43 near its switchpoint for fast switching. This self-biasing increases power consumption in inverter 40 because the P- and N-channel transistors are always somewhat conductive. Furthermore, in order to reduce power, it is desirable to make inverter 40 weak; however, if inverter 40 is made too weak, it no longer matches the threshold characteristics of inverter 43. The result is that the input of inverter 43 is biased above or below its switchpoint, resulting in clock duty cycle distortion. Coupling circuit 26 is also sensitive to power supply noise and noise that is alternating current (AC) coupled through capacitor 42.

Figure 2:
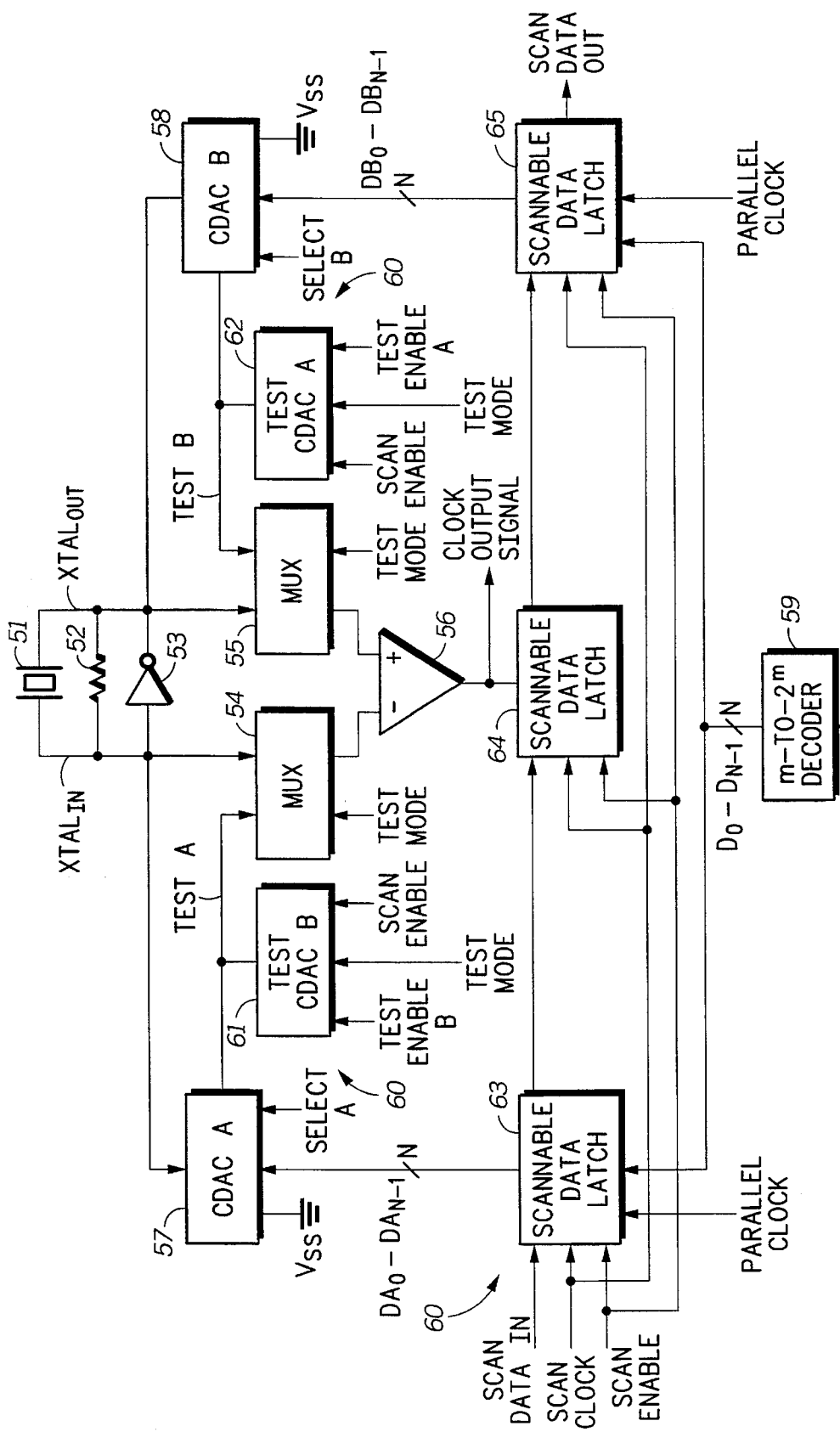
FIG. 2 illustrates in partial block diagram, partial logic diagram, and partial schematic diagram form a pulled-crystal oscillator according to the present invention.

FIG. 2 illustrates in partial schematic diagram, partial logic diagram, and partial block diagram form a pulled-crystal oscillator 50 according to the present invention. Pulled-crystal oscillator 50 includes generally a crystal 51, a resistor 52, an inverter 53, multiplexers 54 and 55 each labelled "MUX", a comparator 56, a first capacitor digital-to-analog converter (CDAC) labelled "CDAC A" 57, a second CDAC labelled "CDAC B" 58, a decoder 59, and a testing circuit 60. Crystal 51 has a first terminal labelled "$XTAL_{IN}$", and a second terminal labelled "$XTAL_{OUT}$". Resistor 52 has a first terminal connected to $XTAL_{IN}$, and a second terminal connected to $XTAL_{OUT}$. Inverter 53 has an input terminal connected to $XTAL_{IN}$, and an output terminal connected to $XTAL_{OUT}$. MUX 54 has a first input terminal connected to a node labelled "TEST A", a second input terminal connected to $XTAL_{IN}$, a control input terminal for receiving a signal labelled "TEST MODE", and an output terminal. MUX 55 has a first input terminal connected to a node labelled "TEST B", a second input terminal connected to $XTAL_{OUT}$, a control input terminal for receiving signal TEST MODE, and an output terminal. Comparator 56 has a negative input terminal connected to the output terminal of MUX 54, a positive input terminal connected to the output terminal of MUX 55, and an output terminal for providing CLOCK OUTPUT SIGNAL.

Figure 3:
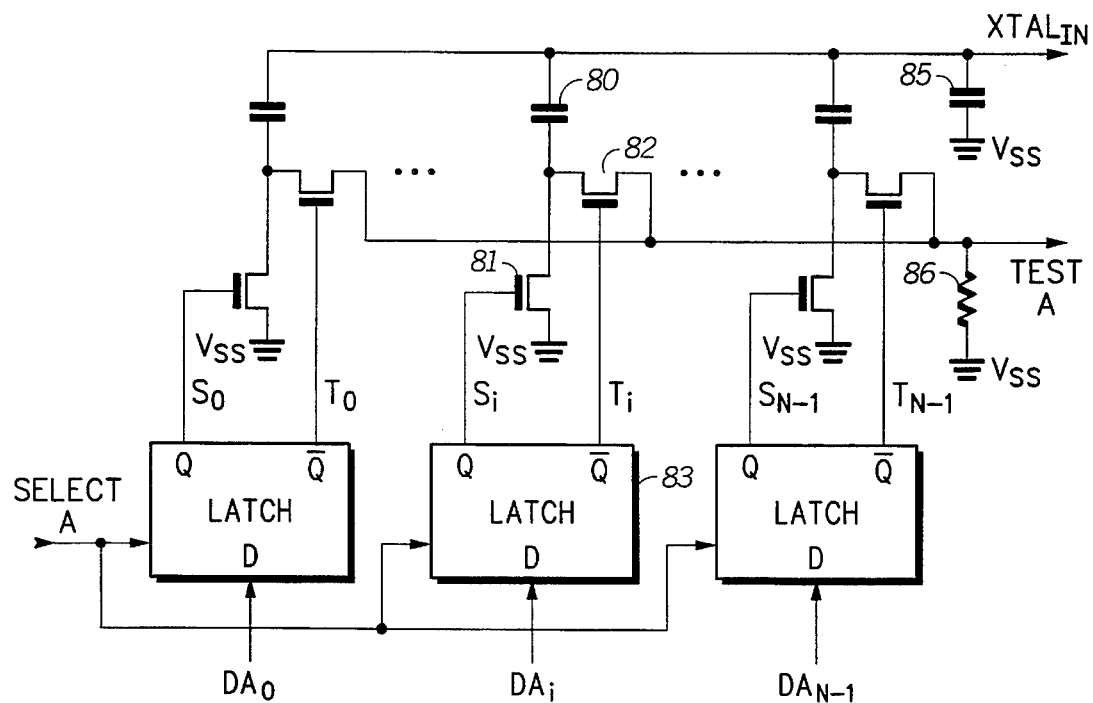
FIG. 3 illustrates in partial block diagram and partial schematic diagram form one of the CDACs of FIG. 2.

CDAC 57 is connected to $XTAL_{IN}$, to the first terminal of MUX 54 at node TEST A, and to $V_{SS}$, and receives an N-bit digital code labelled "$DA_0$–$DA_{N-1}$" at an input terminal thereof and a signal labelled "SELECT A" at a control input terminal thereof. CDAC 58 is connected to $XTAL_{OUT}$, to the second terminal of MUX 55 at node TEST B, and to $V_{SS}$, and receives an N-bit digital code labelled "$DB_0$–$DB_{N-1}$" at an input terminal thereof and a signal labelled "SELECT B" at a control input terminal thereof. The differences between CDACs 57 or 58 and capacitor arrays 24 or 25 of FIG. 1 are understood by referring now to FIG. 3, which illustrates in partial block diagram and partial schematic diagram form CDAC 57. CDAC 57 includes N capacitors each selectively switching a terminal of the corresponding capacitor between $V_{SS}$ and TEST A. For illustrative purposes, CDAC 57 is described with reference to the i-th leg, which includes a capacitor 80, N-channel transistors 81 and 82, and a latch 83. Capacitor 80 has a first terminal connected to $XTAL_{IN}$, and a second terminal. Transistor 81 has a drain connected to the second terminal of capacitor 80, a gate for receiving a signal labelled "$S_i$", and a source connected to $V_{SS}$. Transistor 82 has a drain connected to the second terminal of capacitor 80, a gate for receiving a signal labelled "$T_i$", and a source connected to node TEST A. Latch 83 has a data input terminal for receiving signal $DA_i$, a control input terminal for receiving signal SELECT A, a true output terminal for providing signal $S_i$, and a gated complementary output terminal for providing signal $T_i$.

CDAC 57 also includes a capacitor 85 and a resistor 86. Capacitor 85 has a first terminal connected to $XTAL_{IN}$, and a second terminal connected to $V_{SS}$. Capacitor 85 is a default capacitance which is always present and sets the basic frequency from which the frequency of oscillation is "pulled". Resistor 86 has a first terminal connected to node TEST A, and a second terminal connected to $V_{SS}$. Resistor 86 is a high-valued resistor implemented as either a diffused resistor, or preferably a long-channel MOS transistor which may be made nonconductive when not needed. The advantage of resistor 86 will be described subsequently with reference to FIG. 7.

Signal SELECT A is active either during normal operation or when CDAC 57 is being tested. When signal SELECT A is inactive at a logic low, latch 83 functions to provide signal $S_i$ in response to signal $DA_i$, and keeps signal $T_i$ in an inactive state at a logic low. Thus, capacitor 80 will be selectively connected to $V_{SS}$ through transistor 81, based on the value of corresponding input $DA_i$. When signal SELECT A is active at a logic high, latch 83 provides signals $S_i$ and $T_i$ as complementary output signals. Thus, if $DA_i=0$, then signal $S_i$ is inactive at a logic low keeping transistor 81 nonconductive, and signal $T_i$ is active at a logic high to make transistor 82 conductive and to connect the second terminal of capacitor 80 to node TEST A. If $DA_i=1$, then signal $S_i$ is active at a logic high making transistor 81 conductive, coupling capacitor 80 between $XTAL_{IN}$ and $V_{SS}$. Signal $T_i$ is inactive at a logic low to keep transistor 82 nonconductive. Latch 83 makes signals $S_i$ and $T_i$ nonoverlapping with respect to each other in order to avoid momentary leakage from the first input terminal of MUX 54 through transistors 82 and 81 to $V_{SS}$. Note that CDAC 58 is structurally identical to switched capacitor array 57 and in the following discussion, corresponding elements in CDAC 58 will be described by using the same reference number.

Figure 4:
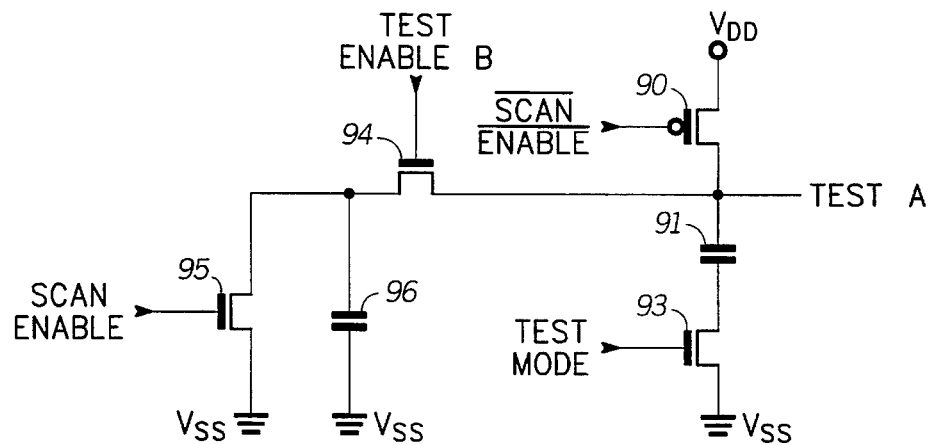
FIG. 4 illustrates in schematic form one of the TEST CDACs of FIG. 2.

Returning now to FIG. 2, decoder 59 has an input terminal for receiving an m-bit digital input signal from a digital loop filter (not shown), and an output terminal for providing N-bit digital code $D_0$–$D_{N-1}$. Testing circuit 60 includes a CDAC 61 labelled "TEST CDAC B", a CDAC 62 labelled "TEST CDAC A", and a scan path formed by scannable data latches 63–65. TEST CDAC 61 is connected to node TEST A, and receives signal TEST MODE, a signal labelled "TEST ENABLE B", and a signal labelled "SCAN ENABLE" at control input terminals thereof. TEST CDAC 62 is connected to node TEST B, and receives signals TEST MODE and SCAN ENABLE and a signal labelled "TEST ENABLE A" at control input terminals thereof. TEST CDACS 61 and 62 are understood with reference to FIG. 4, which illustrates in schematic form TEST CDAC 61 of FIG. 2.

TEST CDAC 61 includes a P-channel transistor 90, a capacitor 91, N-channel transistors 93–95, and a capacitor 96. Transistor 90 has a source connected to a power supply voltage terminal labelled "$V_{DD}$", a gate for receiving a complement of signal SCAN ENABLE labelled "$\overline{\text{SCAN ENABLE}}$", and a drain connected to TEST A. $V_{DD}$ is a more-positive power supply voltage terminal representative of a logic high voltage and having a nominal voltage of approximately 5.0 volts. Signal $\overline{\text{SCAN ENABLE}}$ is preferably generated globally by inverting signal SCAN ENABLE and providing the resulting signal to each of TEST CDACs 61 and 62, but this function was omitted from FIG. 2 to ease discussion. Capacitor 91 has a first terminal connected to the drain of transistor 90, and a second terminal. Transistor 93 has a drain connected to the second terminal of capacitor 91, a gate for receiving signal TEST MODE, and a source connected to $V_{SS}$. Transistor 94 has a drain connected to the drain of transistor 90, a gate for receiving signal TEST ENABLE B, and a source. Transistor 95 has a drain connected to the source of transistor 94, a gate for receiving signal SCAN ENABLE, and a source connected to $V_{SS}$. Capacitor 96 has a first terminal connected to the source of transistor 94, and a second terminal connected to $V_{SS}$.

When VCO 50 is in normal operation mode, signals TEST MODE, SCAN ENABLE, $\overline{\text{SCAN ENABLE}}$, and TEST ENABLE B are inactive at their respective logic levels. During normal operation mode, transistors 90, 93, 94, and 95 are inactive and capacitors 91 and 96 are floating. During test mode, signal TEST MODE is active at a logic high, making transistor 93 conductive to connect the second terminal of capacitor 91 to $V_{SS}$. When test data is being shifted into the scan path, signal $\overline{\text{SCAN ENABLE}}$ becomes active, precharging the first terminal of capacitor 91 to $V_{DD}$. Signal SCAN ENABLE also becomes active, discharging the first terminal of capacitor 96 to $V_{SS}$. Signal TEST ENABLE B remains inactive, isolating the first terminal of capacitor 96 from node TEST A. When the scan data has been properly shifted into the scan path, signals SCAN ENABLE and $\overline{\text{SCAN ENABLE}}$ again become inactive for testing, but by this time the first terminal of capacitor 91 has been precharged to approximately $V_{DD}$.

During the actual test, signal TEST ENABLE B becomes active, connecting the first terminal of capacitor 96 to node TEST A, and causing capacitor 91 to discharge into capacitor 96. In the preferred embodiment, capacitors 91 and 96 are equal-valued. In the absence of any parasitic capacitance, the voltage on node TEST A should approach approximately $V_{DD}/2$ or about 2.5 volts. However, the parasitic capacitance on node TEST A also stores charge during the precharge period, increasing the capacitance with which capacitor 96 shares charge. Thus, the voltage on node TEST A will be above $V_{DD}/2$. This voltage is provided through MUX 54 of FIG. 2 to the negative input terminal of comparator 56 to provide a comparison voltage, or offset, against which CDAC 58 is tested. The structure and operation of TEST CDAC 62, which is used when testing CDAC 57, is identical except that TEST CDAC 62 is connected to node TEST B, and a transistor corresponding to transistor 94 receives signal TEST ENABLE A at its gate.

Returning now to FIG. 2, scannable data latch 63 has a parallel input terminal connected to the output terminal of decoder 59 for receiving signals $D_0$–$D_{N-1}$, a parallel clock input terminal for receiving a signal labelled "PARALLEL CLOCK", a serial data input terminal for receiving a signal labelled "SCAN DATA IN", a scan clock input terminal for receiving a signal labelled "SCAN CLOCK", a control input terminal for receiving signal SCAN ENABLE, a parallel output terminal for providing signals $DA_0$–$DA_{N-1}$ to capacitor array 54, and a serial data output terminal. Signal PARALLEL CLOCK is a high-speed clock which is some sub-multiple of CLOCK OUTPUT SIGNAL and which switches synchronously therewith. In the illustrated embodiment, PARALLEL CLOCK has a frequency equal to one-half the frequency of CLOCK OUTPUT SIGNAL.

Scannable data latch 64 has a parallel input terminal connected to the output terminal of comparator 56, a serial data input terminal connected to the serial data output terminal of scannable data latch 63, a scan clock input for receiving signal SCAN CLOCK, a control input terminal for receiving signal SCAN ENABLE, and a serial data output terminal. Scannable data latch 65 has a parallel input terminal connected to the output terminal of decoder 59 for receiving signals $D_0$–$D_{N-1}$, a parallel clock input terminal for receiving signal PARALLEL CLOCK, a serial data input terminal connected to the serial data output terminal of scannable data latch 64, a scan clock input signal for receiving signal SCAN CLOCK, a control input terminal for receiving signal SCAN ENABLE, a parallel output terminal for providing signals $DB_0$–$DB_{N-1}$ to capacitor array 58, and a serial data output terminal for providing a signal labelled "SCAN DATA OUT". During normal operation mode, signal SCAN ENABLE is inactive, and scannable data latches 63 and 65 latch new values of input signals $D_0$–$D_{N-1}$ to provide as output signals $DA_0$–$DA_{N-1}$ and $DB_0$–$DB_{N-1}$, respectively, synchronously with the PARALLEL CLOCK. During test mode, MUXes 54 and 55 operatively disconnect crystal 51 from comparator 56, stopping the CLOCK OUTPUT SIGNAL and the PARALLEL CLOCK from switching. Thus, during test mode, scannable data latches 63 and 65 no longer latch new values of parallel input data signals $D_0$–$D_{N-1}$. The SCAN DATA IN signal is used to shift serial test data in synchronously with the SCAN CLOCK. Signal SCAN ENABLE is active while data is being shifted in, inhibiting the output of latches 63 and 65. Once the test data is properly aligned in scannable data latches 63 and 65, signal SCAN ENABLE is deactivated to enable the outputs thereof.

In overall operation, pulled-crystal oscillator 50 has two modes of operation, normal operation mode and test mode. During normal operation mode, pulled-crystal oscillator 50 provides low signal jitter and avoids difficult circuit design tradeoffs, resulting in both low power consumption and a reliable fifty percent duty cycle clock. In normal operation mode, various capacitors in CDACs 57 and 58 are switched into oscillator 50 by digital codes $DA_0$–$DA_{N-1}$ and $DB_0$–$DB_{N-1}$, respectively, each of which is the same as digital code $D_0$–$D_{N-1}$. In other embodiments, digital code $DA_0$–$DA_{N-1}$ need not be the same as digital code $DB_0$–$DB_{N-1}$. In test mode, pulled-crystal oscillator 50 provides a scannable testing apparatus which is able to detect open capacitors in a short amount of time. In test mode, digital codes $DA_0$–$DA_{N-1}$ and $DB_0$–$DB_{N-1}$ enable selected capacitors in response to a sequence of data bits conducted through latches 63–65 through the SCAN DATA IN signal line and in general, $DA_0$–$DA_{N-1}$ is not the same as $DB_0$–$DB_{N-1}$ during test mode.

Normal operation mode is signified by signal TEST MODE being inactive at a logic low. In normal operation mode, testing circuit 60 is disabled, CDACs 54 and 55 are enabled, and MUXes 54 and 55 select the second inputs thereof. In normal operation mode, pulled-crystal oscillator 50 consumes less power than oscillator 20 of FIG. 1 because the inputs of comparator 56 do not need to be biased. Oscillator 50 also provides CLOCK OUTPUT SIGNAL with less signal jitter than oscillator 20 because comparator 56 is a comparator with high common-mode and power-supply rejection, and thus is not susceptible to being biased above or below its switchpoint or to noise-induced changes in its switchpoint.

Figure 5:
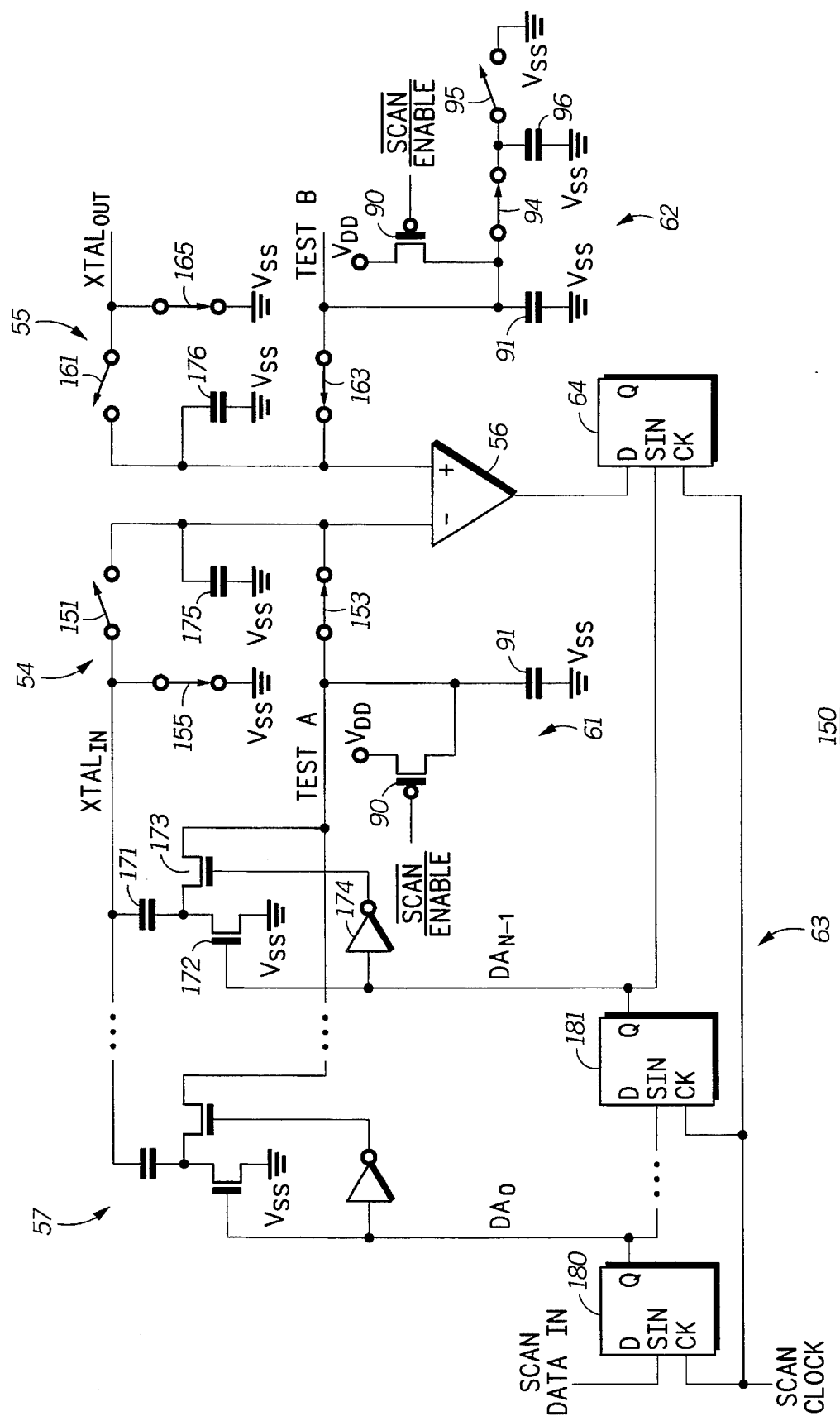
FIG. 5 illustrates partial block diagram, partial logic diagram, and partial schematic diagram form a portion of the pulled-crystal oscillator of FIG. 2 useful in understanding a test mode thereof.

Test mode is signified by signal TEST MODE being active at a logic high. FIG. 5 illustrates partial block diagram, partial logic diagram, and partial schematic diagram form a portion 150 of pulled-crystal oscillator 50 of FIG. 2 useful in understanding a test mode thereof. Pulled-crystal oscillator 150 includes generally portions of MUXes 54 and 55, comparator 56, CDAC 57, TEST CDAC 62, and scannable latches 63 and 64. It should be understood that while the same reference numbers are used for corresponding elements of FIG. 2, some of the circuitry used has been omitted or simplified.

FIG. 5 illustrates an "A" testing cycle in which capacitors in CDAC 57 are tested. Thus, CDAC 57 and TEST CDAC 62 are operatively connected to comparator 56. MUX 54 disconnects $XTAL_{IN}$ from the negative input terminal of comparator 56, represented by a switch 151 thereof being open. Another switch 155 is closed to connect $XTAL_{IN}$ to $V_{SS}$. MUX 54 connects node TEST A to the negative input terminal of comparator 56, represented by a switch 153 thereof being closed. Likewise, MUX 55 disconnects $XTAL_{OUT}$ from the positive input terminal of comparator 56, represented by a switch 161 thereof being open. Another switch 165 is closed to connect $XTAL_{OUT}$ to $V_{SS}$. MUX 55 connects node TEST B to the positive input terminal of comparator 56, represented by a switch 163 thereof being closed.

FIG. 5 shows two illustrative legs of CDAC 57, including a most significant leg with a capacitor 171, N-channel transistors 172 and 173, and an inverter 174. Capacitor 171 has a first terminal connected to $XTAL_{IN}$, and a second terminal. Transistor 172 has a drain connected to the second terminal of capacitor 171, a gate for receiving signal $DA_{N-1}$, and a source connected to $V_{SS}$. Transistor 173 has a drain connected to node TEST A, a gate, and a source connected to the drain of transistor 172. Inverter 174 has an input terminal for receiving signal $DA_{N-1}$, and an output terminal connected to the gate of transistor 173.

A capacitor is tested by setting a corresponding scan data bit to a binary zero, and setting all other scan data bits to binary ones. Signal SCAN ENABLE is activated to scan this data in through the SCAN DATA IN signal line synchronously with SCAN CLOCK. Scannable data latch 63 includes N D-type scan flip flops including illustrative flip flops 180 and 181. To test capacitor 171, a binary zero is scanned in through SCAN DATA IN during a first clock, followed by N–1 binary ones. After these N cycles of SCAN CLOCK, the binary zero has propagated into scan flip flop 181. Thus, the Q output terminal of scan flip flop 181 is set to a binary zero, making transistor 172 nonconductive and transistor 173 conductive. The result is that the first terminal of capacitor 171 is connected to $V_{SS}$, through switch 155 in MUX 54, and the second terminal of capacitor 171 is connected to the negative input terminal of comparator 56 through node TEST A.

During data input scanning, signal $\overline{\text{SCAN ENABLE}}$ causes transistors 90 of TEST CDACs 61 and 62 to precharge nodes TEST A and TEST B, respectively, to $V_{DD}$. These voltages are held at approximately $V_{DD}$ by a parasitic capacitance 175 on the negative input terminal of comparator 56, and by a parasitic capacitance 176 on the positive input terminal of comparator 56 and by capacitors 91 in TEST CDACs 61 and 62, respectively. After the data has been aligned in scannable data latch 63, signal SCAN ENABLE becomes inactive and transistors 90 of TEST CDACs 61 and 62 are nonconductive. Capacitors 91 in TEST CDAC 62 and 176 discharge into capacitor 96, through a path represented by a switch 94, assigned the same reference number as transistor 94 of FIG. 4, being closed. The first terminal of capacitor 96 had previously been discharged to $V_{SS}$, through a path represented now by a switch 95, assigned the same reference number as transistor 95 of FIG. 4, being open. Capacitors 91 and 96 preferably have equal values which are smaller than the smallest capacitor in CDAC 57. Thus, the comparison voltage on the positive input terminal of comparator 56 will be somewhat above mid-supply due to parasitic capacitor 176, and is preferably made about 3.75 volts.

This comparison voltage initially causes comparator 56 to switch low, because the 5.0 volts on the negative terminal of comparator 56 is greater than the 3.75 volts on the positive terminal thereof. However, if capacitor 171 and the associated control circuitry (transistors 172 and 173 and inverter 174) are functional, capacitors 91 and 175 will discharge into capacitor 171, bringing the negative terminal of comparator 56 to a lower voltage than the comparison voltage. This discharging is guaranteed by sizing capacitor 96 to be smaller than the smallest capacitor in CDAC 57 and having approximately equal parasitic capacitances 175 and 176.

Figure 6:
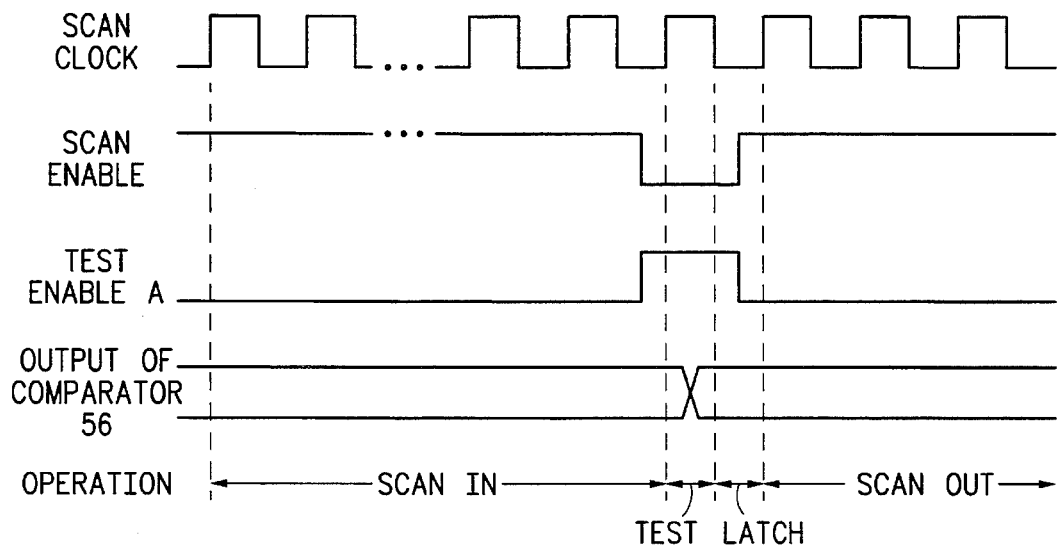
FIG. 6 illustrates a timing diagram of the pulled-crystal oscillator of FIG. 2 during the test mode.

FIG. 6 illustrates a timing diagram of pulled-crystal oscillator 50 of FIG. 2 during the test mode. FIG. 6 illustrates an "A" testing cycle, in which a selected capacitor in CDAC 57 is tested. FIG. 6 illustrates four signals, SCAN CLOCK, SCAN ENABLE, TEST ENABLE A, and the output of comparator 56, versus time on the horizontal axis. FIG. 6 also illustrates four intervals relevant to the test sequence. A first interval, labelled "SCAN IN", occurs when data is being read into the scan path. During the SCAN IN interval, signal SCAN ENABLE is active, inhibiting the outputs of scannable data latches 63 and 65 of FIG. 2, and discharging capacitor 96 of FIG. 4 to $V_{SS}$. Active signal $\overline{\text{SCAN ENABLE}}$ (not shown in FIG. 6) also causes the input signal lines to comparator 56 to be precharged to approximately $V_{DD}$ through transistors 90. Signal TEST ENABLE A is inactive, isolating capacitor 96 from node TEST A. Data is input serially and shifted through the scan path synchronously with SCAN CLOCK.

A second interval, labelled "TEST", follows the SCAN IN interval. During the TEST interval, signal SCAN ENABLE becomes inactive, causing scannable data latches 63 and 65 to provide their outputs to CDACs 57 and 58, respectively. Signal TEST ENABLE A becomes active, providing a comparison voltage to the positive input terminal of comparator 56 by causing the charge stored in capacitors 91 and 176 to discharge into capacitor 96. The connection of the selected capacitor in CDAC 57 causes the output of comparator 56 to reflect the outcome of the test during the TEST interval.

During a third interval, labelled "LATCH", the output of comparator 56 is latched into the scan path. Scannable data latch 64 latches the output of comparator 56 on the falling edge of SCAN CLOCK.

A fourth interval labelled "SCAN OUT" follows the LATCH interval. During the SCAN OUT interval, signal SCAN ENABLE is active, again inhibiting the outputs of scannable data latches 63 and 65. Data is output serially and shifted through the scan path synchronously with SCAN CLOCK until the data bit corresponding to the output of comparator 56 is output as signal SCAN DATA OUT. Preferably, a single physical latch implements the function of latches 63 and 65. This sharing of circuitry is possible because during the normal operation mode, corresponding capacitors in CDACs 57 and 58 are activated simultaneously, and during test mode signals SELECT A and SELECT B ensure that only one of CDACs 57 and 58 are tested at any one time. Thus, a single clock is required during the SCAN OUT interval to output the value of comparator 56 latched during the LATCH interval as signal SCAN DATA OUT, keeping test time to a minimum.

In a preferred test sequence, testing of capacitors in CDACs 57 and 58 is preceded by a pretest sequence which tests "A" and "B" control circuitry. For example, in order to test the "A" control circuitry, a sequence of N binary ones is scanned into scannable data latch 63. Since no capacitors in CDAC 57 are connected, capacitor 96 in TEST CDAC 62 should pull the voltage at the positive input terminal of comparator 56 below the voltage at the negative input terminal, causing comparator 56 to output a logic low.

The "A" capacitors are tested one at a time by setting signal SELECT A to a logic high and signal SELECT B to a logic low. Each capacitor is tested in turn by scanning in a binary zero in the corresponding bit position zero, and a binary one in all other bit positions. In the test of CDAC 57, if the i-th capacitor is not open, then it will pull the voltage at the negative input terminal of comparator 56 below that at the positive input terminal thereof. Thus, if the output of comparator 56 is a logic high, then the i-th capacitor is not open. The test of the "B" capacitors in CDAC 58 proceeds in a similar fashion, except that a logic low output of comparator 56 indicates a functional capacitor. It is possible to write control software to either test all elements, or to exit the test after the first defective element is detected. Note that while it is preferred to pretest control circuitry, other test sequences may test both the control circuitry and the CDAC capacitors together.

Figure 7:
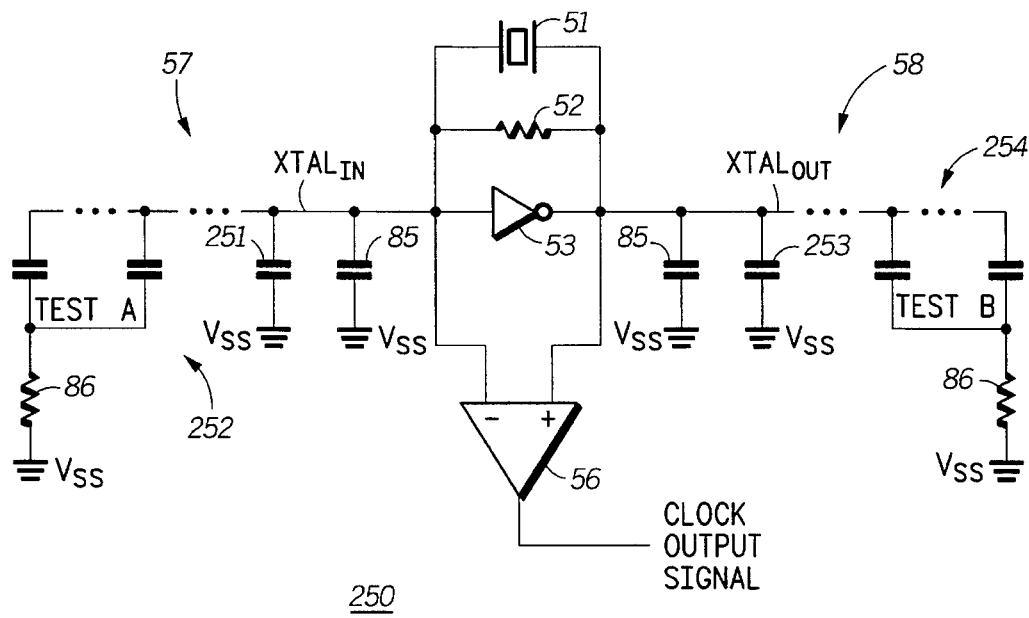
FIG. 7 illustrates in partial logic diagram and partial schematic diagram form a portion of the pulled-crystal oscillator of FIG. 2 useful understanding an advantage thereof in normal operation mode.

FIG. 7 illustrates in partial logic diagram and partial schematic diagram form a portion 250 of pulled-crystal oscillator 50 of FIG. 2 useful in understanding an advantage thereof in normal operation mode. In pulled-crystal oscillator 250, crystal 51, resistor 52, inverter 53, and comparator 56 are connected as in FIG. 2. Note that MUXes 54 and 55 are omitted for clarity. CDAC 57 includes capacitor 85, an active capacitor 251, and N–1 inactive capacitors 252. Since it is active, capacitor 251 has a first terminal connected to $XTAL_{IN}$, and a second terminal connected to $V_{SS}$. Since signal SELECT A is active, each of the N–1 inactive capacitors has a first terminal connected to $XTAL_{IN}$, and a second terminal connected to node TEST A. CDAC 58 includes capacitor 85, an active capacitor 253, and N–1 inactive capacitors 254. Since it is active, capacitor 253 has a first terminal connected to $XTAL_{OUT}$, and a second terminal connected to $V_{SS}$. Since signal SELECT B is active, each of the N−1 inactive capacitors has a first terminal connected to $XTAL_{OUT}$, and a second terminal connected to node TEST B.

In normal operation mode, the second terminals of the inactive capacitors are connected to either TEST A or TEST B. Since CDACs 57 and 58 connect these nodes to $V_{SS}$ through high-valued resistors 86, the inactive capacitors slowly charge up to the average voltage present on the $XTAL_{IN}$ and $XTAL_{OUT}$ nodes. The values of resistors 86 must be chosen such that the RC time constant, for a capacitance of the smallest capacitor in CDACs 57 and 58, is much longer than the period of oscillation. The result is that when an inactive capacitor is activated, it is already charged to the average voltage on a corresponding one of nodes $XTAL_{IN}$ and $XTAL_{OUT}$. The switchpoint occurs at the zero-crossing point of the inputs of comparator 56 because new input data is latched by PARALLEL CLOCK, and thus switches synchronously with CLOCK OUTPUT SIGNAL. Since the zero-crossing point occurs near the average voltages on the $XTAL_{IN}$ and $XTAL_{OUT}$ nodes, there will be virtually no "glitch" on $XTAL_{IN}$ and $XTAL_{OUT}$ when the inactive capacitors are switched in.

Figure 8:
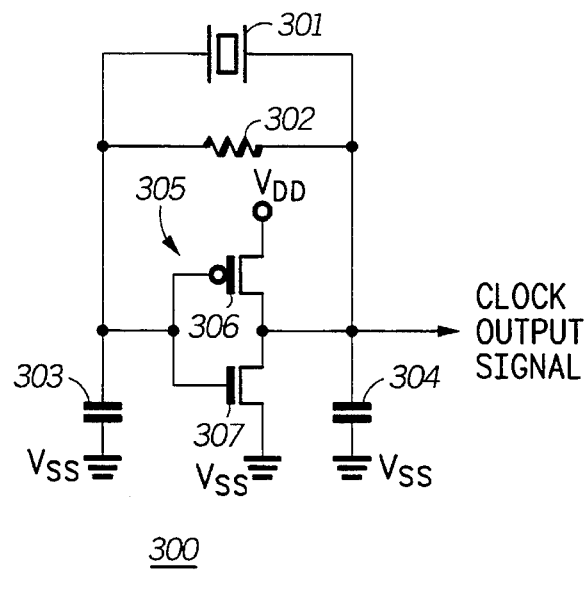
FIG. 8 illustrates in schematic form a crystal oscillator using an inverter according to the prior art.

FIG. 8 illustrates in schematic form a crystal oscillator 300 using an inverter 305 according to the prior art. Crystal oscillator 300 includes a crystal 301, a resistor 302, capacitors 303 and 304, and inverter 305. Crystal 301 has first and second terminals. Resistor 302 has a first terminal connected to the first terminal of crystal 301, and a second terminal connected to the second terminal of crystal 301. Capacitor 303 has a first terminal connected to the first terminal of crystal 301, and a second terminal connected to $V_{SS}$. Capacitor 304 has a first terminal connected to the second terminal of crystal 301, and a second terminal connected to $V_{SS}$. Inverter 305 has a first terminal connected to the first terminal of crystal 301, and a second terminal connected to the second terminal of crystal 301. Inverter 305 is a conventional CMOS inverter including a P-channel transistor 306, and an N-channel transistor 307. Transistor 306 has a source connected to $V_{DD}$, a gate connected to the first terminal of crystal 301, and a drain connected to the second terminal of crystal 301. Transistor 307 has a drain connected to the drain of transistor 306, a gate connected to the first terminal of crystal 301, and a source connected to $V_{SS}$.

Oscillator 300, known as a Pierce oscillator, is commonly used in CMOS integrated circuits. Crystal 301 is an off-chip crystal having a desired resonant frequency. Resistor 302 and capacitors 303 and 304 are normally off-chip because they require too much integrated circuit area in most embodiments, but may be integrated in embodiments requiring relatively-small values or in pulled-crystal oscillators. Transistors 306 and 307 are almost always integrated on-chip using conventional CMOS processes.

Although oscillator 300 is simple and reliable, it has higher power consumption in applications in which $V_{DD}$ is equal to approximately 5 volts and which require large values for capacitors 303 and 304, such as a pulled-crystal oscillator. Oscillator 300 is a good solution when $V_{DD}$ is slightly above ($V_{TN}+|V_{TP}|$), where $V_{TN}$ is the gate-to-source threshold voltage of transistor 307, and $V_{TP}$ is the gate-to-source threshold voltage of transistor 306. However, when $V_{DD}$ is about 5.0 volts and $V_{TN}$ and $|V_{TP}|$ are each about 0.8 volts, and transistors 306 and 307 in inverter 305 are sized strongly enough to oscillate with a large capacitive load, inverter 305 will have undesirably large overlap current. It is possible to provide a reduced positive power supply voltage at the source of transistor 306, but the reduced supply will require an additional package pin for a decoupling capacitor, which may not be available in some applications. In addition, it is always desirable to minimize integrated circuit pin count. Thus, a new inverter design is needed in order to reduce power consumption for such applications.

Figure 9:
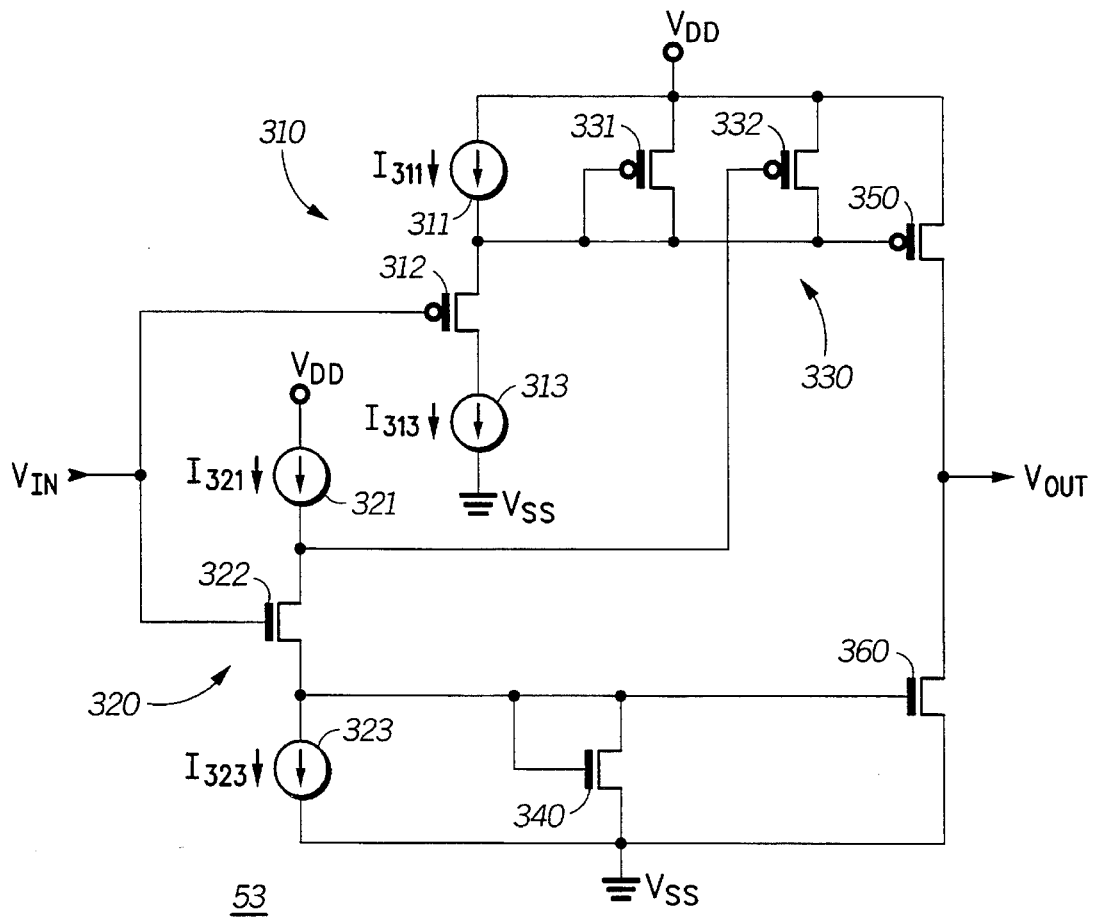
FIG. 9 illustrates in schematic form the inverter of FIG. 2.

FIG. 9 illustrates in schematic form inverter 53 of FIG. 2. Inverter 53 includes generally an P-side source-follower portion 310, an N-side source-follower portion 320, a P-side gate control portion 330, an N-side gate control portion 340, a P-channel transistor 350, and an N-channel transistor 360.

P-side source-follower portion includes a current source 311, a P-channel transistor 312, and a current source 313. Current source 311 has a first terminal connected to $V_{DD}$, and a second terminal, and conducts a current labelled "$I_{311}$". Transistor 312 has a source connected to the second terminal of current source 311, a gate for receiving an input voltage signal labelled "$V_{IN}$", and a drain. In inverter 53, $V_{IN}$ is connected to the $XTAL_{IN}$ terminal of crystal 51, but in other embodiments may be an arbitrary input voltage such as a CMOS logic signal. Current source 313 has a first terminal connected to the drain of transistor 312, and a second terminal connected to $V_{SS}$, and conducts a current labelled "$I_{313}$". Note that as used herein, all current conducting devices are considered to be current "sources", although current source 313 may also be considered a current sink.

N-side source-follower portion 320 includes a current source 321, a N-channel transistor 322, and a current source 323. Current source 321 has a first terminal connected to $V_{DD}$, and a second terminal, and conducts a current labelled "$I_{321}$". Transistor 322 has a drain connected to the second terminal of current source 321, a gate for receiving signal $V_{IN}$, and a source. Current source 323 has a first terminal connected to the source of transistor 322, and a second terminal connected to $V_{SS}$, and conducts a current labelled "$I_{323}$".

P-side gate control portion 330 includes P-channel transistors 331 and 332. Transistor 331 has a source connected to $V_{DD}$, a gate connected to the source of transistor 312, and a drain connected to the source of transistor 312. Transistor 332 has a source connected to $V_{DD}$, a gate connected to the second terminal of current source 321, and a drain connected to the source of transistor 312. N-side gate control portion 340 includes a single N-channel transistor also referred to as 340. Transistor 340 has a drain connected to the source of transistor 322, a gate connected to the source of transistor 322, and a drain connected to $V_{SS}$. P-channel transistor 350 has a source connected to $V_{DD}$, a gate connected to the source of transistor 312, and a drain for providing a signal labelled "$V_{OUT}$". In inverter 53, $V_{OUT}$ is connected to the $XTAL_{OUT}$ terminal of crystal 51, but in other embodiments may be considered a CMOS logic signal. N-channel transistor 360 has a drain connected to the drain of transistor 350, a gate connected to the source of transistor 322, and a source connected to $V_{SS}$.

Inverter 53 is very effective in minimizing overlap currents. First, inverter 53 includes source follower transistor pairs 312 and 350, and 322 and 360. These source-follower pairs reduce the available headroom between $V_{DD}$ and the sum of the thresholds of transistors 350 and 360. Second, transistor 331 in P-side gate control portion 330 and transistor 340 in N-side gate control portion 340 are clamping transistors which limit the gate-to-source voltages seen by output transistors 350 and 360, respectively. The current in P-side gate control portion 330 is limited to the difference in current sources 313 and 311, namely a value of $(I_{313}-I_{311})$. Likewise, the current in N-side gate control portion 340 is limited to the difference in current sources 321 and 323, namely a value of $(I_{321}-I_{323})$. Currents $I_{313}$ and $I_{321}$ must be greater than currents $I_{311}$ and $I_{323}$, respectively, and these differences and appropriate transistor size ratios determine the maximum currents flowing through transistors 350 and 360, respectively. Specifically, the maximum current through transistor 350 is equal to $$I_{350}(MAX)=(I_{313}-I_{311})*(W/L)_{350}/(W/L)_{331} \quad [1]$$

where $I_{350}(MAX)$ is the approximate maximum drain current of transistor 350, $(W/L)_{350}$ is the gate width-to-length ratio of transistor 350, and $(W/L)_{331}$ is the gate width-to-length ratio of transistor 331. Likewise, the maximum current through transistor 360 is equal to $$I_{360}(MAX)=(I_{321}-I_{323})*(W/L)_{360}/(W/L)_{340} \quad [2]$$

where $I_{360}(MAX)$ is the approximate maximum drain current of transistor 360, $(W/L)_{360}$ is the gate width-to-length ration of transistor 360, and $(W/L)_{340}$ is the gate width-to-length ratio of transistor 340.

As long as currents $I_{311}$, $I_{313}$, $I_{321}$, and $I_{323}$ are reasonably well-controlled, the output current will be relatively independent of changes in device characteristics due to process, temperature, and power supply variations. Current sources 311 and 321 are preferably formed by P-channel transistors biased by a stable bias voltage, and current sources 313 and 323 are preferably formed by N-channel transistors biased by another stable bias voltage. These bias voltages are preferably generated from a stable reference (not shown) such as from a $V_{BE}/R$ or $\Delta V_{BE}/R$ generator. As used here, "$V_{BE}$" is the forward-biased base-to-emitter diode voltage drop of a reference bipolar transistor, "$\Delta V_{BE}$" is the difference in $V_{BE}$ between two bipolar transistors, and "R" is the resistance of a reference resistor. The bias voltages are preferably provided by a bandgap reference voltage generator, providing a $\Delta V_{BE}/R$ reference. Because current I is very stable, transistors 350 and 360 may be made strong (i.e., have large W/L ratios) without having large overlap currents. This strength is desirable when inverter 53 is used in crystal oscillator inverters because it ensures oscillation even with high capacitive loading.

Transistor 332 is a "helper" device that helps to make transistor 350 nonconductive when $V_{IN}$ switches to a logic high. Being a P-channel device, transistor 350 will normally have a gate width-to-length ratio two to three times greater than that of transistor 360. However this gate sizing provides correspondingly greater capacitance on the source of transistor 312. When voltage $V_{IN}$ is increasing, the combined effects of clamping transistor 331 and current source 311 may slow the increase in voltage at the gate of transistor 350 so much that a large overlap current in transistors 350 and 360 results. Under these conditions, the voltage at the drain of transistor 322 is falling; thus, helper transistor 332 biased by the voltage at the drain of transistor 322 provides additional current to make transistor 350 nonconductive quicker.

Note that a similar helper device cannot be used to help make transistor 360 nonconductive quicker, because having such a helper device would form a latch structure which could make both transistor 350 and transistor 360 simultaneously nonconductive. However, the smaller capacitance on the gate of transistor 360 reduces the need for a second helper device.

Inverter 53 has greatly reduced power consumption over inverter 300 of FIG. 8 both when $V_{DD}$ is equal to the standard 5.0 volts and at a reduced value of 3.3 volts. Table I illustrates simulation results when inverters 300 and 53 were used in an oscillator with a 20.48 megahertz (MHz) crystal resonance frequency:

TABLE I

| Circuit | $V_{DD}$ (V) | Typical Power (mW) | Maximum Power (mW) |
| --- | --- | --- | --- |
| Inverter 300 | 5.0 | 14.1 | 39 |
| Inverter 300 | 3.3 | 9.0 | 25.6 |
| Inverter 53 | 5.0 | 6.75 | 14.85 |

For the purposes of this comparison, "typical" means 25 degrees Celsius, typical processing parameters, and 50 picofarads (pF) on $V_{IN}$ and $V_{OUT}$ (connected to nodes XTAL$_{IN}$ and XTAL$_{OUT}$, respectively). "Maximum" means $-40$ degrees Celsius, best case speed processing (lowest N- and P-channel thresholds, shortest effective channel lengths, etc.), and 100 picofarads (pF) on $V_{IN}$ and $V_{OUT}$. In addition, for each of the three cases, the last-stage transistors were sized as small as possible while still ensuring oscillation under all operating and processing conditions. Thus, inverter 53 significantly reduces power consumption over inverter 300 at 5.0 volts. Inverter 53 also reduces power consumption even when inverter 300 is powered from a reduced-supply voltage at 3.3 volts.

While inverter 53 includes both P- and N-side source follower and clamp circuits, either the P- or the N-side circuitry may be used independently to reduce overlap current. Current sources 313 and 321, connected to the drains of their respective source follower transistors, may be omitted in other embodiments. However, current source 321 is important to the operation of helper transistor 332 and should be used when helper transistor 332 is present.

Referring to FIG. 5 in conjunction with FIG. 9, note that during test mode, both nodes XTAL$_{IN}$ and XTAL$_{OUT}$ are connected to $V_{SS}$, potentially causing a short circuit through transistor 350 from $V_{DD}$ to $V_{SS}$. This short circuit may be avoided in a variety of ways, such as by disconnecting $V_{IN}$ and $V_{OUT}$ from nodes XTAL$_{IN}$ and XTAL$_{OUT}$, respectively, during test mode. Signal $V_{OUT}$ also may be placed in a high impedance state by connecting the gates of transistors 350 and 360 to $V_{DD}$ and $V_{SS}$, respectively, during the test mode. Preferably, however, the gates of both transistors 350 and 360 are driven to $V_{DD}$ during test mode so that transistor 360 performs the function of switch 165 to connect node XTAL$_{OUT}$ to $V_{SS}$.

While the invention has been described in the context of a preferred embodiment, it will be apparent to those skilled in the art that the present invention may be modified in numerous ways and may assume many embodiments other than those specifically set out and described above. For example, the present invention contemplates different test sequences, both with and without pretests. Other embodiments may use different control signals, and implement scannable data latches 63 and 65 of FIG. 2 in separate circuitry. Various forms of resistors such as diffused resistors, long-channel transistors, and the like are contemplated. Note that TEST CDACs 61 and 62 operate to introduce an appropriate comparison voltage at the input of comparator 56 against which the capacitors of CDACs 58 and 57 may be tested. While this method of providing the comparison voltage is preferred because variations in capacitor sizing in the TEST CDAC will track variations in the CDAC under test, alternate methods of providing the comparison voltage are possible. The alternate methods include but are not limited to: selectively creating an imbalance in current sources in an input stage of comparator 56; selectively creating an imbalance in input device sizes of a differential input stage of comparator 56; and connecting the appropriate input terminal of comparator 56 to a reference voltage. Also in other embodiments, one of CDACs 57 and 58 may be replaced with a fixed capacitor, and the oscillator frequency is "pulled" by changing the capacitance value at only one of nodes $XTAL_{IN}$ and $XTAL_{OUT}$. In addition, the comparator may be connected to crystal terminals of a fixed capacitor oscillator to reduce clock output signal jitter. Accordingly, it is intended by the appended claims to cover all modifications of the invention which fall within the true spirit and scope of the invention.

I claim:

1. A method for reducing jitter and improving testability of an oscillator, comprising the steps of: coupling a selected one of a first plurality of capacitors between a first crystal terminal and a predetermined voltage terminal in response to a first digital input code;

coupling a selected one of a second plurality of capacitors between a second crystal terminal and said predetermined voltage terminal in response to a second digital input code;

coupling said first crystal terminal to a first input terminal of a comparator;

coupling said second crystal terminal to a second input terminal of said comparator;

providing a clock output signal at an output terminal of said comparator;

selecting one of said first plurality of capacitors as a capacitor under test;

coupling a first test capacitor between a first node and said predetermined voltage terminal;

precharging said first node and a second node to a precharge voltage at a beginning of a test period;

coupling said capacitor under test between said second node and said predetermined voltage terminal;

coupling a second test capacitor between said first node and said predetermined voltage terminal; and coupling said first and second nodes to said first and second input terminals of said comparator, respectively;

whereby said capacitor under test is determined to be functional if said output terminal of said comparator is in a first logic state at an end of said test period, and said capacitor under test is determined to be open if said output terminal of said comparator is in a second logic state at said end of said test period.

2. The method of claim 1 further comprising the step of discharging said second test capacitor to said predetermined voltage terminal prior to said step of coupling said second test capacitor between said first node and said predetermined voltage terminal.

3. The method of claim 1 further comprising the step of scanning in data to select said capacitor under test through a scan path.

4. The method of claim 3 further comprising the step of latching a test output voltage on said output terminal of said comparator and scanning out said test output voltage through said scan path.

5. The method of claim 1 further comprising the step of selecting others of said first plurality of capacitors as said capacitor under test and repeating said steps of coupling said first test capacitor between said first node and said predetermined voltage terminal, precharging, coupling said capacitor under test between said second node and said predetermined voltage terminal, coupling said second test capacitor between said first node and said predetermined voltage terminal, and coupling said first and second nodes to said first and second input terminals of said comparator, respectively, for each of said first plurality of capacitors.

6. A method for testing a pulled-crystal oscillator, the pulled-crystal oscillator having a capacitor digital-to-analog converter (CDAC) coupled to a first crystal terminal, and a capacitor coupled to a second crystal terminal, comprising the steps of:

coupling a first terminal of a first test capacitor to a first terminal of a comparator;

providing a first predetermined voltage to a second terminal of said first test capacitor;

precharging a voltage at said first terminal of said first test capacitor to a second predetermined voltage during a first portion of a test period;

providing a comparison voltage to a second terminal of said comparator, said comparison voltage characterized as being between said first and second predetermined voltages;

coupling a first terminal of a selected capacitor of a plurality of capacitors of the CDAC to said first terminal of said comparator during a second portion of said test period;

coupling a second terminal of said selected capacitor to said first predetermined voltage during said second portion of said test period; and providing an output of said comparator as a test result of said selected capacitor at an end of said second portion of said test period;

whereby said selected capacitor provides a voltage to said first terminal of said comparator between said comparison voltage and said first predetermined voltage if said selected capacitor is functional, and said selected capacitor provides said voltage to said first terminal of said comparator between said second predetermined voltage and said comparison voltage if said selected capacitor is not functional.

7. The method of claim 6 wherein said step of providing said comparison voltage comprises the steps of:

coupling a first terminal of a second test capacitor to said second terminal of said comparator;

providing said first predetermined voltage to a second terminal of said second test capacitor;

precharging a voltage at said first terminal of said second test capacitor to said second predetermined voltage during said first portion of said test period;

providing said first predetermined voltage to a first terminal of a third test capacitor during said first portion of said test period;

providing said first predetermined voltage to a second terminal of said third test capacitor; and coupling said first terminal of said second test capacitor to said first terminal of said third test capacitor during said second portion of said test period.

8. The method of claim 6 further comprising the step of selecting others of said plurality of capacitors of the CDAC and repeating each of said previous steps for each of said others of said plurality of capacitors, thereby testing each capacitor in the CDAC.

9. The method of claim 6 further comprising the step of providing a second CDAC for the capacitor coupled to the second crystal terminal.

10. A method for testing a pulled-crystal oscillator, the pulled-crystal oscillator having a first capacitor digital-to-analog converter (CDAC) coupled to a first crystal terminal, and a second CDAC coupled to a second crystal terminal, comprising the steps of:

coupling a first test capacitor between a first node and a predetermined voltage terminal;

coupling a second test capacitor between a second node and said predetermined voltage terminal;

precharging said first and second nodes to a precharge voltage;

coupling a selected capacitor in the first CDAC between said first node and said predetermined voltage terminal;

coupling a third test capacitor between said second node and said predetermined voltage terminal; and comparing a voltage on said first node to a voltage on said second node;

whereby said selected capacitor is determined to be functional if a difference between said voltage on said first node and said precharge voltage is greater than a difference between said voltage on said second node and said precharge voltage, and said selected capacitor is determined to be open otherwise.

11. The method of claim 10 further comprising the step of discharging said third test capacitor to said predetermined voltage terminal prior to said step of coupling said third test capacitor between said second node and said predetermined voltage terminal.

12. The method of claim 10 further wherein said step of comparing comprises the steps of:

coupling said first node to a first terminal of a comparator; and coupling said second node to a second terminal of said comparator;

whereby said comparator provides a test result on an output terminal thereof.

13. The method of claim 12 further comprising the step of scanning in data to select a capacitor in the first CDAC through a scan path.

14. The method of claim 13 further comprising the step of latching a voltage on said output terminal of said comparator and scanning out said voltage on said output terminal of said comparator through said scan path.

15. The method of claim 10 further comprising the step of repeating each previous step for each of a plurality of capacitors in the first CDAC.

16. An oscillator with improved testability, comprising:

a first node for being coupled to a first terminal of a crystal;

a second node for being coupled to a second terminal of said crystal;

a first capacitor digital-to-analog converter (CDAC) coupled to said first node, said first CDAC switched by a first digital input code;

a second CDAC switched by a second digital input code coupled to said second node;

a comparator having a first input terminal coupled to said first node, a second input terminal coupled to said second node, and an output terminal for providing a clock output signal;

test means coupled to a third node, for providing a first comparison voltage to said third node when said second CDAC is selected during a test mode;

first multiplexer means for coupling said first node to said first input terminal of said comparator during a normal operation mode, and for coupling said third node to said first input terminal of said comparator during said test mode; and second multiplexer means for coupling said second node to said second input terminal of said comparator during said normal operation mode, and for coupling a fourth node to said second input terminal of said comparator during said test mode;

said second CDAC further coupling a selected one of a first plurality of capacitors between said fourth node and a predetermined voltage terminal when selected during said test mode.

17. The oscillator of claim 16 further comprising:

second test means coupled to said fourth node, for providing a second comparison voltage to said fourth node when said first CDAC is selected during said test mode;

said first CDAC further coupling a selected one of a second plurality of capacitors between said third node and said predetermined voltage terminal when selected during said test mode.

18. The oscillator of claim 16 wherein said test means comprises:

a first transistor having a first current electrode coupled to a precharge voltage terminal, a control electrode for receiving a first control signal, and a second current electrode coupled to said third node;

a first capacitor having a first terminal coupled to said third node, and a second terminal;

a second transistor having a first current electrode coupled to said second terminal of said first capacitor, a control electrode for receiving a test mode signal, and a second current electrode coupled to said predetermined voltage terminal;

a third transistor having a first current electrode coupled to said third node, a control electrode for receiving a second control signal, and a second current electrode;

a fourth transistor having a first current electrode coupled to said second current electrode of said third transistor, a control electrode for receiving a complement of said first control signal, and a second current electrode coupled to said predetermined voltage terminal; and a second capacitor having a first terminal coupled to said second current electrode of said third transistor, and a second terminal coupled to said predetermined voltage terminal;

said first control signal active during a first portion of a test period, said second control signal active during a second portion of said test period.

19. The oscillator of claim 16 further comprising a scan path having a parallel input terminal for receiving a third digital input code, a serial data input terminal for receiving test input data, a parallel data output terminal coupled to said first CDAC for providing said first digital input code to select at least one capacitor of said first CDAC during said test mode, a serial data output terminal for providing test output data, a control input terminal for receiving a scan enable signal, and a clock input terminal for receiving a scan clock signal.

20. The oscillator of claim 19 wherein said scan path further has a test result input terminal coupled to said output terminal of said comparator.

21. The oscillator of claim 16 wherein said first CDAC comprises a plurality of legs, each of said plurality of legs comprising:

a capacitor having a first terminal coupled to said first node, and a second terminal;

a first switching element for switching said second terminal of said capacitor to a predetermined voltage terminal when a corresponding bit of said first digital input code is in a first logic state; and a second switching element for switching said second terminal of said capacitor to a third node when said corresponding bit of said first digital input code is in a second logic state;

and wherein said oscillator further comprises multiplexer means for switching said first terminal of said capacitor to said predetermined voltage terminal when said first CDAC is tested during said test mode.

22. The oscillator of claim 21 further comprising a resistor having a first terminal coupled to said third node, and a second terminal coupled to said predetermined voltage terminal.

23. The oscillator of claim 22 wherein a resistance of said resistor is sufficient to make a resistance-capacitance (RC) time constant of said resistor and a least-valued capacitor of said first CDAC greater than a period of said clock output signal.

* * * * *